(12) United States Patent
Francis et al.

(10) Patent No.: US 9,044,774 B2
(45) Date of Patent: Jun. 2, 2015

(54) VENTED COMBINATORIAL PROCESSING CELL

(75) Inventors: Aaron Francis, San Jose, CA (US); John Schmidt, Oakland, CA (US); Kenneth Alfred Williams, Livermore, CA (US)

(73) Assignee: Intermolecular, Inc., San Jose, CA (US)

( * ) Notice: Subject to any disclaimer, the term of this patent is extended or adjusted under 35 U.S.C. 154(b) by 1961 days.

(21) Appl. No.: 11/966,809

(22) Filed: Dec. 28, 2007

(65) Prior Publication Data
US 2009/0155476 A1    Jun. 18, 2009

Related U.S. Application Data

(60) Provisional application No. 61/014,672, filed on Dec. 18, 2007.

(51) Int. Cl.
| | | |
|---|---|---|
| *B05C 5/00* | (2006.01) | |
| *C40B 60/00* | (2006.01) | |
| *B05C 3/20* | (2006.01) | |
| *H01L 21/67* | (2006.01) | |

(52) U.S. Cl.
CPC .............. *B05C 3/20* (2013.01); *H01L 21/6704* (2013.01); *H01L 21/67051* (2013.01); *H01L 21/6708* (2013.01); *H01L 21/6715* (2013.01); *H01L 21/67207* (2013.01)

(58) Field of Classification Search
USPC .................. 73/580; 422/130, 136; 204/228.3; 156/345.12; 451/291
See application file for complete search history.

(56) References Cited

U.S. PATENT DOCUMENTS

| | | | |
|---|---|---|---|
| 3,878,727 A * | 4/1975 | Burns ........................... | 356/246 |
| 4,915,812 A * | 4/1990 | Parce et al. ................ | 204/403.1 |
| 5,368,634 A * | 11/1994 | Hackett ........................... | 95/260 |
| 5,603,351 A | 2/1997 | Cherukuri et al. | |
| 6,063,633 A | 5/2000 | Willson, III | |
| 6,306,658 B1 | 10/2001 | Turner et al. | |
| 6,756,109 B2 | 6/2004 | Warren et al. | |
| 6,818,110 B1 | 11/2004 | Warren et al. | |
| 6,834,990 B2 | 12/2004 | Nielsen | |
| 6,864,092 B1 | 3/2005 | Turner et al. | |
| 6,890,492 B1 | 5/2005 | Turner et al. | |
| 6,902,934 B1 | 6/2005 | Bergh et al. | |
| 6,924,149 B2 | 8/2005 | Turner et al. | |

(Continued)

FOREIGN PATENT DOCUMENTS

| | | |
|---|---|---|
| JP | 2002-370156 A | 12/2002 |
| JP | 2005-125668 A | 5/2005 |
| WO | WO 2007093939 A1 * | 8/2007 |

OTHER PUBLICATIONS

Erichsen et al., Combinatorial Microelectrochemistry: Development and Evaluation of an Electrochemical Robotic System, Review of Scientific Instruments, May 17, 2005, pp. 062204-1-062204-11, vol. 76.

(Continued)

*Primary Examiner* — Charles Capozzi (57) ABSTRACT

A vented combinatorial processing cell is described, including a sleeve having an end forming a fluid seal with a region of a substrate, a flow head including a vent and disposed in the sleeve to dispense fluid onto the region, the flow head, the substrate, and the sleeve defining a chamber for processing the region, a fluid source attached to the flow head to deliver the fluid into the chamber, and a vacuum port attached to the flow head to remove fluid from the chamber.

16 Claims, 6 Drawing Sheets

(56) References Cited

U.S. PATENT DOCUMENTS

| | | | |
|---|---|---|---|
| 6,994,827 B2 | 2/2006 | Safir et al. | |
| 7,045,358 B2 | 5/2006 | Chandler | |
| 7,115,234 B2 | 10/2006 | Freitag et al. | |
| 7,172,732 B2 | 2/2007 | Van Erden et al. | |
| 7,288,229 B2 | 10/2007 | Turner et al. | |
| 7,544,574 B2 | 6/2009 | Chiang et al. | |
| 2002/0106813 A1 | 8/2002 | Smith et al. | |
| 2002/0185379 A1* | 12/2002 | Schrenk et al. | 204/604 |
| 2003/0032198 A1 | 2/2003 | Lugmair et al. | |
| 2003/0075204 A1* | 4/2003 | de Larios et al. | 134/21 |
| 2005/0064251 A1 | 3/2005 | Li et al. | |
| 2005/0232074 A1 | 10/2005 | Higashihara et al. | |
| 2005/0287573 A1 | 12/2005 | Stafslien et al. | |
| 2006/0083664 A1 | 4/2006 | Bahr | |
| 2006/0169045 A1* | 8/2006 | Shinohara et al. | 73/580 |
| 2007/0029189 A1 | 2/2007 | Zach | |
| 2007/0082485 A1 | 4/2007 | Chiang et al. | |
| 2007/0082508 A1 | 4/2007 | Chiang et al. | |
| 2007/0089857 A1* | 4/2007 | Chiang et al. | 165/80.2 |
| 2007/0202610 A1 | 8/2007 | Chiang et al. | |
| 2007/0202614 A1 | 8/2007 | Chiang et al. | |
| 2007/0227656 A1 | 10/2007 | Boyd et al. | |
| 2007/0267631 A1 | 11/2007 | Weiner et al. | |
| 2008/0156769 A1 | 7/2008 | Weiner et al. | |

OTHER PUBLICATIONS

Baeck et al., Automated electrochemical synthesis and characterization of TiO2 supported Au nanoparticle electrocatalysts, Measurement and Science Technology, Dec. 16, 2004, pp. 54-59, vol. 16.

Fleischauer et al., Design and Testing of a 64-Channel Combinatorial Electrochemical Cell, Journal of the Electrochemical Society, Sep. 19, 2003, pp. A1465-A1469, vol. 150 (11).

Liu et al. Array membrane electrode assemblies for high throughput screening of direct methanol fuel cell anode catalysts, Journal of Electroanalytical Chemistry, 2002, pp. 49-55, vol. 535.

PCT Search Report, PCT Application No. PCT/US2008/087238, May 25, 2009.

* cited by examiner

VENTED COMBINATORIAL PROCESSING CELL

PRIORITY CLAIM TO PROVISIONAL APPLICATION

A claim for priority is hereby made under the provisions of 35 U.S.C. § 119 for the present application based upon U.S. Provisional Application No. 61/014,672 filed on Dec. 18, 2007, which is incorporated herein by reference.

FIELD OF THE INVENTION

The present invention relates generally to semiconductor processing. More specifically, a vented combinatorial processing cell is described.

BACKGROUND OF THE INVENTION

Semiconductor processing typically includes various techniques performed on a substrate (e.g., a wafer) to form electronic devices such as integrated circuits. Examples of such techniques include layer formation using various deposition techniques (e.g., using electroless or electrochemical deposition, physical vapor deposition, or chemical vapor deposition), cleaning techniques, and chemical mechanical planarization.

Some of these techniques are aqueous or solvent based techniques. In other words, a semiconductor substrate can be processed by deploying processing chemicals onto the substrate using water or other liquids or fluids as a medium (i.e., "wet" processing). Various conditions can be used with these techniques to achieve different results. For example, various temperatures, flow rates, concentrations, etc. of the fluids can be used as desired.

Consistent application of the semiconductor processes is needed to achieve predictable and reliable results. For example, if a flow rate of a fluid over a substrate is inconsistent or uncontrollable, the same process performed twice may have very different results. Inconsistencies such as these lead to increases in failed devices, reductions in yields, and unreliable research data. The consistent application of the materials and processed used is also important in combinatorial techniques so that the results form the various regions can be reliably compared across one or more substrates.

Thus, what are needed are techniques for improving the consistency of semiconductor processes within a processing cell, across multiple regions, and subject to various processing conditions.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, an apparatus for performing combinatorial processing is described. The apparatus includes a cell for processing a region of a substrate. The cell includes a flow head attached to a fluid source and a vacuum port connected to a waste container to collect used fluids. The fluid source provides processing fluids to a chamber defined by a sleeve, the substrate, and the flow head, and the vacuum port evacuates the processing fluids. The flow head also includes one or more vents that may be vented to atmosphere or any other environment or ambient pressure. The vents allow the processing fluids to flow more evenly and continuously through the region, providing for more consistent and predictable processing. Additionally, if the processing fluids are left in the chamber (i.e., not flowing through the chamber), the vents allow the fluids to be more efficiently and effectively evacuated from the cell.

Combinatorial Processing

Figure 1:
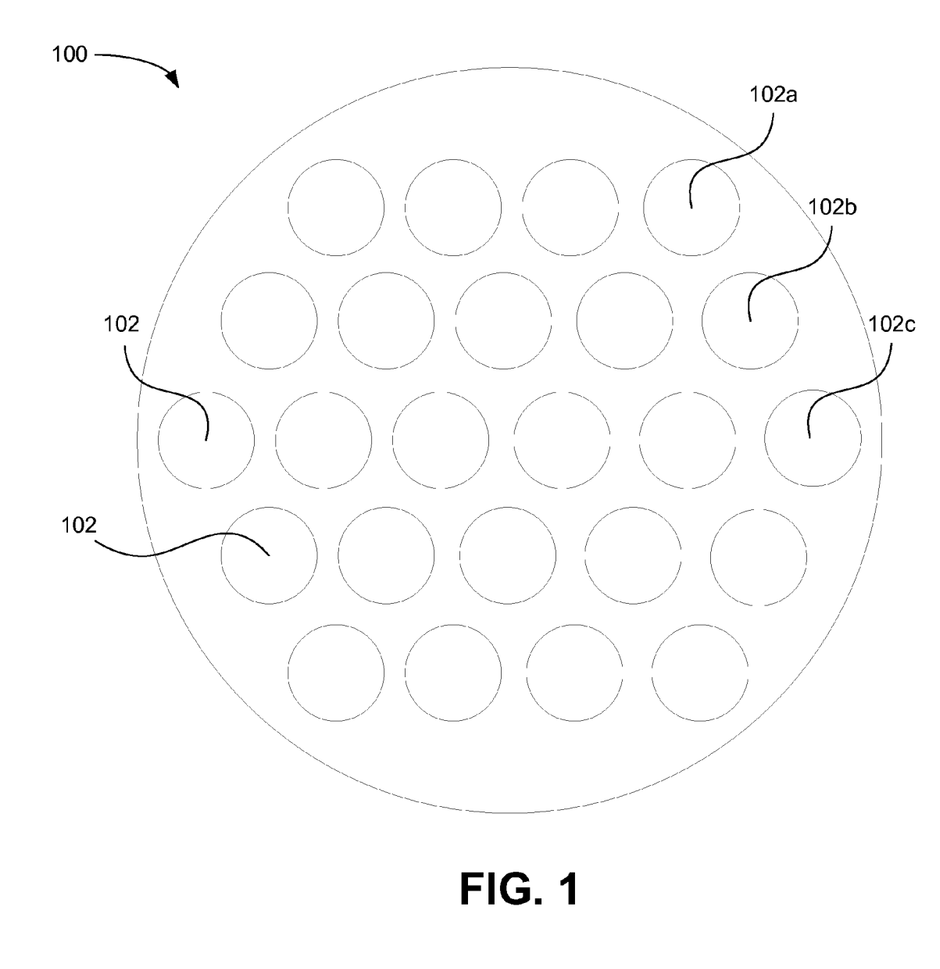
FIG. 1 illustrates multiple regions of a substrate for combinatorial processing.

FIG. 1 illustrates multiple regions of a substrate for combinatorial processing. Combinatorial processing may include any processing (e.g., semiconductor processing) that varies the processing conditions across more than one region of one or more substrates. As used herein, a substrate may be, for example, a semiconductor (e.g., silicon) wafer or portion thereof, other semiconductor substrate, or solar photovoltaic circuitry. The term "substrate" includes a coupon, which is a diced portion of a wafer, or any other device on which semiconductor processes are performed. The coupon or substrate may contain one die, multiple die (connected or not through the scribe), or portions of die with useable test structures. In some embodiments, multiple coupons, or die can be diced from a single wafer and processed combinatorially.

A substrate 100 includes several regions 102 on which semiconductor processes can be performed. In one aspect of combinatorial processing, at least one of the regions 102 is processed differently than the others by varying one of materials, process conditions, or process sequences. For example, the regions 102a, 102b, and 102c may each have an electroless layer deposited on them. The region 102a may use a first chemical formulation, the region 102b a second chemical formulation, and the region 102c a third chemical formulation. The resulting layers can be compared to determine the relative efficacy of each of the formulations. None, one, or more of the formulations can then be selected to use with further combinatorial processing or larger scale processing (e.g., manufacturing). Any process variable (e.g., time, composition, temperature) or the process sequence itself can be varied using combinatorial processing. For more information about combinatorial processing, see U.S. patent application Ser. No. 11/352,077 entitled "Methods for Discretized Processing and Process Sequence Integration of Regions of a Substrate" and filed Feb. 10, 2006.

Each of the regions 102 may or may not be site isolated. Site isolation refers to a condition where the regions 102 can be processed individually and independently without interference from neighboring regions. For example, one or more of the regions 102 may include a sleeve having an end that forms a fluid seal with the substrate 100. The sleeve is configured to contain processing fluids (e.g., chemicals), and is made from a material (e.g. polytetrafluoroethylene (PTFE)) that does not react with the processing chemicals used. The chemicals do not leak out of the region into which they were dispensed, and each region 102 can be processed and evaluated individually.

Fluid Flow through a Cell

Figure 2A:
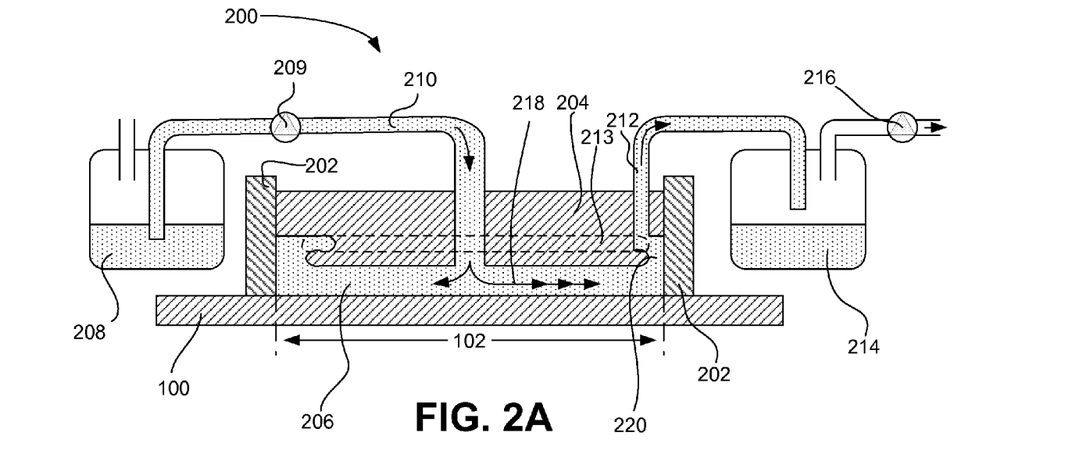
FIG. 2A illustrates one technique for flowing fluid through a cell.

FIG. 2A illustrates an apparatus and technique for flowing fluid through a cell 200. The cell 200 may be a site-isolated or other cell in which combinatorial processing is performed. As shown in FIG. 2A, the cell 200 is shown in a cross-sectional view of the cell 200 on the substrate 100. The cell 200 includes a sleeve 202 to contain the processing fluids, and a flow head 204 disposed in the sleeve 202 to dispense fluids into a chamber 206 defined by the sleeve 202, the flow head 204, and the substrate 100. The chamber 206 contains fluid for performing various semiconductor processes on the region 102.

The fluids are dispensed out of a fluid source 208 using a pressure vessel 209 (or other pressurizing device such as a pump) that provides a positive fluid pressure through a flow tube 210 into the chamber 206. The fluids circulate through the chamber 206, and exit through a vacuum port 212 at a vacuum plenum 213. The vacuum plenum 213 is a toroidal (or any other shaped) region above the chamber 206 in which fluids may collect. The vacuum port 212 is attached to a waste container 214, which collects used fluids. A vacuum pump 216 draws the fluids through the vacuum port 212 and into the waste container 214.

Figure 2B:
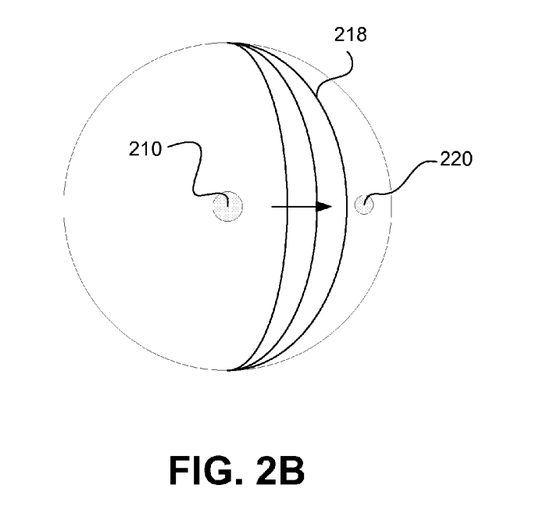
FIG. 2B illustrates an underside of a flow head of FIG. 2A.

FIG. 2B illustrates an underside of the flow head 204. The fluid flow 218 through the chamber 206 is illustrated using FIG. 2B. The flow 218 is more heavily directed toward the vacuum port 212 side of the flow head 204. A flow differential between the end of the chamber including the vacuum port 212 and the other end of the chamber 206 may occur because of fluctuations in the incoming fluid pressure and the vacuum (i.e., outgoing fluid pressure) removing the fluid from the chamber 206.

Vented Combinatorial Cell

Figure 3A:
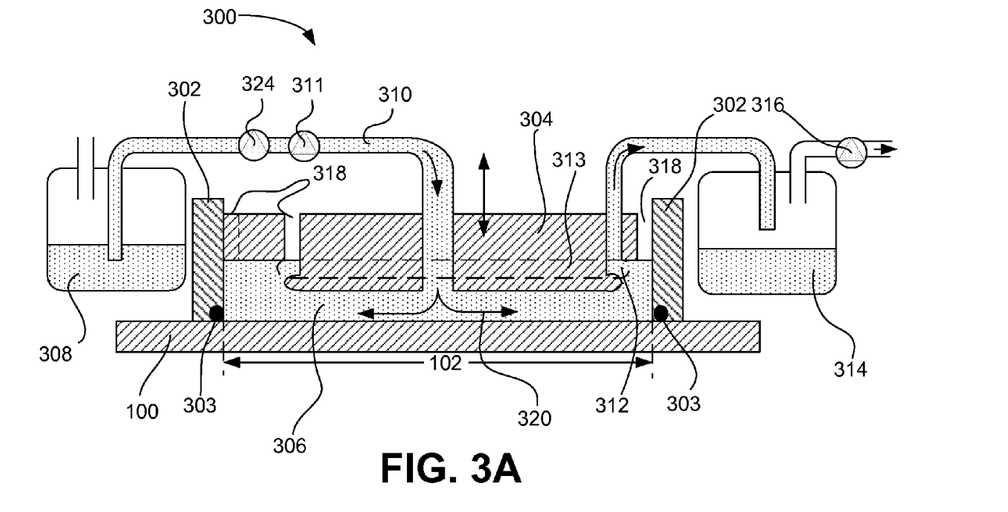
FIG. 3A illustrates flowing fluid through a cell using venting.

FIG. 3A illustrates flowing fluid through a cell 300 using venting. The cell 300 may be a site-isolated or other cell in which combinatorial processing is performed. The cell 300 may be one of many cells used in combinatorial processing (see FIG. 4). In FIG. 3A, the cell 300 is shown in a cross-sectional view of the cell 300 on the substrate 100. The cell 300 includes a sleeve 302 to contain the processing fluids, and a flow head 304 disposed in the sleeve 302 to dispense fluids into a chamber 306 defined by the sleeve 302, the flow head 304, and the substrate 100. The sleeve 302 may have an end 303 including a lip, an o-ring, or other seal or any other interface where it contacts the substrate 100 to create a fluid seal. The fluid seal may form a seal with the substrate to define one or a plurality of regions on the substrate for processing. The chamber 306 contains fluid for performing various semiconductor processes on the region 102.

The flow head 304 can include any flow cell, and may be modular in design. For example, a modular flow cell may include two or more portions. In a flow cell having two portions, one may connect to the facilities of the processing tool (e.g., a flow tube and a vacuum port), and the other portion may connect to the first portion. The second portion is interchangeable to change the flow parameters of the flow head 304. For example, the interchangeable second portion may be changed to use different flow or spray patterns or may include protrusions or mechanical devices such as stirrers. Additionally, the flow head 304 can be adjustable to move toward and away from the substrate 100 to reduce and enlarge the size of the chamber 306. In this implementation, the flow head 304 is attached to a motor or other device to adjust the height of the flow head 304 relative to the substrate 100.

The processing fluids are dispensed out of a fluid source 308 and through a flow tube 310 into the chamber 306 using a pressure vessel 311 (or other pressurizing device, such as a pump). The fluid source 308 may be a fluid bottle, a manifold, or other distribution device. The fluids circulate through the chamber 306, and exit through a vacuum port 312. In some embodiments, multiple flow tubes or vacuum ports may be included, and disposed anywhere within the flow head 304. The vacuum port 312 may include the point at which fluids are evacuated from the chamber 306 and into a waste container 314, as well as a tube leading to a waste container 314. The vacuum port 312 is attached to the chamber 306 at a vacuum plenum 313, and is further attached to the waste container 314, which collects used fluids. The vacuum plenum 313 is shown as a toroidal region (here, a torus) that may alternatively be a void defining any appropriate shape and having any desired size. A vacuum pump 316 draws the fluids through the vacuum port 312 and into the waste container 314.

The flow head 304 includes one or more vents 318. The vents 318 (which may also be referred to as "vent ports") are vented to any desired pressure, for example, atmospheric pressure to maintain an approximately constant fluid flow 320 rate through the chamber 306. In some embodiments, multiple vents 318 may be used to provide consistent flow rates within the chamber. As shown in FIG. 3A, the flow rate 320 (indicated by arrows) is approximately equal in all directions away from the flow tube 310 because of the venting in the cell 300. Vents 318 help provide relief in the vacuum plenum 313 to equalize the pressure through the chamber 306. The equalization of the pressure further results in an equalization in flow rate through the chamber 306 and more consistent application of process chemicals and results from using those process chemicals.

The vents 318 can be located anywhere within or without the flow head 304 and may be in any number and have any positional configuration. The vents 318 can also be attached to extensions or tubes that vent to remote areas or to regions of different pressure. The vents 318 introduce a constant pressure to the chamber 306, so that the fluid flow is not dependent on the pressure differential between the incoming fluid pressure through the flow tube 310 and the outgoing fluid pressure provided by the vacuum pump 316. The pressure differential may change due to variances in the performance of the fluid source 308 or the vacuum pump 316, leading to inconsistent fluid flow. As an example, the pressure at the vacuum port 312 is maintained at atmospheric pressure using the vent 318, so that the flow rate is kept at equilibrium and equalized throughout the chamber 306.

Figure 3B:
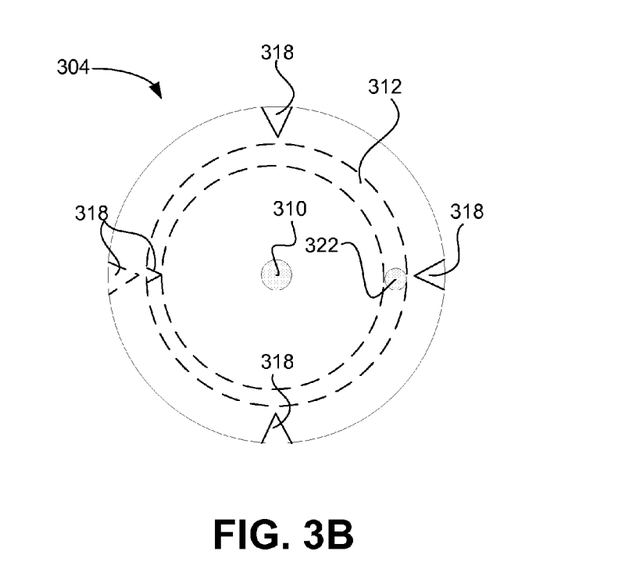
FIG. 3B illustrates an underside view of a flow head of FIG. 3A.

FIG. 3B illustrates an underside view of the flow head 304. Four vents 318 are shown, however it is understood that any number of vents 318 may be used. Further, as describe above, although four vents 318 are shown here located at the perimeter of the flow head 304, any number of vents 318 may be used in any configuration, having any size or shape, and may be in any location. As shown in FIG. 3B, the vents 318 may be on the perimeter of the flow head 304, while as shown in FIG. 3A, the vents 318 may also be located inside the perimeter of the flow head 304, for example at the vacuum plenum 313. In one embodiment, the number of vents 318 may be chosen to enable consistent and even fluid flow throughout the chamber 306 so that the region 102 is evenly processed. For example, spacing the vents 318 evenly around the flow head 304 can create an approximately equal pressure throughout the chamber 306, allowing even flow.

The fluid source 308 may, using the pressure vessel 311, provide fluid to the chamber 306 at a pressure $P_{source}$, which may be any pressure, but in some embodiments may range from 0 to +15 pounds per square inch (psi) or 0 to +30 psi. The vacuum port 312 may remove fluid from the chamber 306 at a pressure $P_{vacuum}$, which may be any pressure, but in some embodiments may range from −12 to −14 psi or −5 to −20 psi. Any pressure that is desired for a combinatorial process can be used, and these examples are not meant to be limiting. The flow tube 310, vacuum port 312, and the chamber 306 may create some impedance, which could be 3 psi, for example. The pressures can be chosen to equalize flow through the chamber 306. For example, $P_{source}$ could be +15 psi and $P_{vacuum}$ could be −12 psi, which, when taking into account the impedance in the flow tube 310 would provide even flow through the chamber 306. The vents 318 provide a constant pressure at the vacuum port 312, which accounts for variances in the source and vacuum pressures (e.g., the source pressure is temporarily reduced), evening out flow by temporarily raising or lowering the fluid level, which is generally at the level of the vacuum port 312.

Fluid flow 320 through the chamber 306 can have any flow rate. In some examples, the flow rate is between 0-100 mL/min, and may differ depending on tool configurations and specific experiment parameters. Venting allows a particular flow rate to be chosen and more closely adhered to.

The cell 300 can be used with different flow modes. Two possible configurations are known as flow mode and bucket mode. In flow mode, the region 102 is processed by flowing a constant stream of fluid through the chamber 306. The cell 300 shown in FIG. 3A is operating in flow mode, since fluid is flowing through the flow tube 310, the chamber 306, and being evacuated by the vacuum port 312. The fluid level is approximately at the level of the vacuum port 312, and the fluid is in contact with a bottom surface of the flow head 304. In some embodiments, the flow head 304 is positioned at a distance from the substrate 100 to enable various flow profiles, such as laminar flow. For example, with some configurations, the distance between the flow head 204 and the substrate 100 may be 0.25-1 mm to enable flow mode (although any distance may be chosen). The vents 318 help to maintain a constant flow rate by reducing pressure differentials between the flow tube 310 and the vacuum port 312, improving the consistency of regions processed in flow mode.

In flow mode, the chamber 306 can be evacuated using a valve 324, which may be part of the pressure vessel 311. The valve 324 is closed to stop flow from the fluid source 308 while the vacuum pump 316 continues to operate and remove fluid from the chamber 306. In some embodiments, trace amounts of fluid may be left in the chamber 306 after evacuation is complete. Various pre- and post-process cleans (e.g., nitrogen gas, solvent-based cleans) can be used to remove unwanted fluid after the evacuation.

Figure 3C:
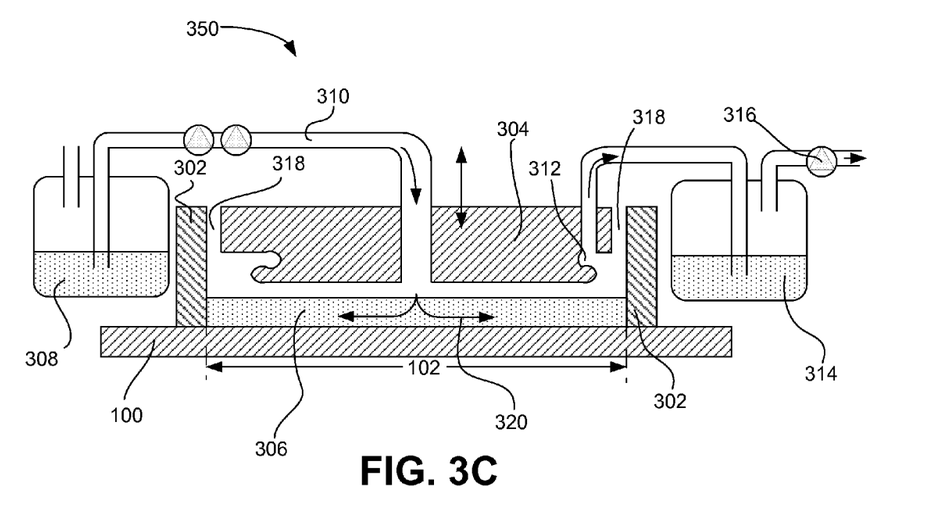
FIG. 3C shows a cell operating in bucket mode.

FIG. 3C shows a cell 350 operating in bucket mode. In bucket mode a processing fluid is deposited in the chamber 306 for a predetermined amount of time. The fluid is then evacuated. In bucket mode, the fluid is deposited into the chamber 306 and left sitting without additional fluid being added or existing fluid being removed until the fluid is to be evacuated (e.g., for a predetermined amount of time or until a predetermined condition is met). In some embodiments, the flow head 304 does not contact the fluid. The distance between the bottom of the flow head 304 and the substrate 100 may be any distance, and in some examples if the distance is greater it would be in flow mode. For example, the distance may be 5-10 mm.

The vents 318 help to maintain an appropriate fluid level and improve evacuation of the fluid. The fluid is evacuated by lowering the adjustable flow head 304 toward the substrate 100 to squeeze the fluid out of the chamber 306 and into the vacuum port 312. The vents 318 equalize the pressure in the chamber 306, preventing the fluid from backing up into the flow tube 310 (and toward the source), and directing the fluid toward the vacuum port 312. As with flow mode, trace amounts of fluid may be left in the chamber 306 after evacuation. The residual fluid can be removed using pre- and post-process cleans, nitrogen gas, etc.

Combinatorial Processing with Vented Cells

Figure 4:
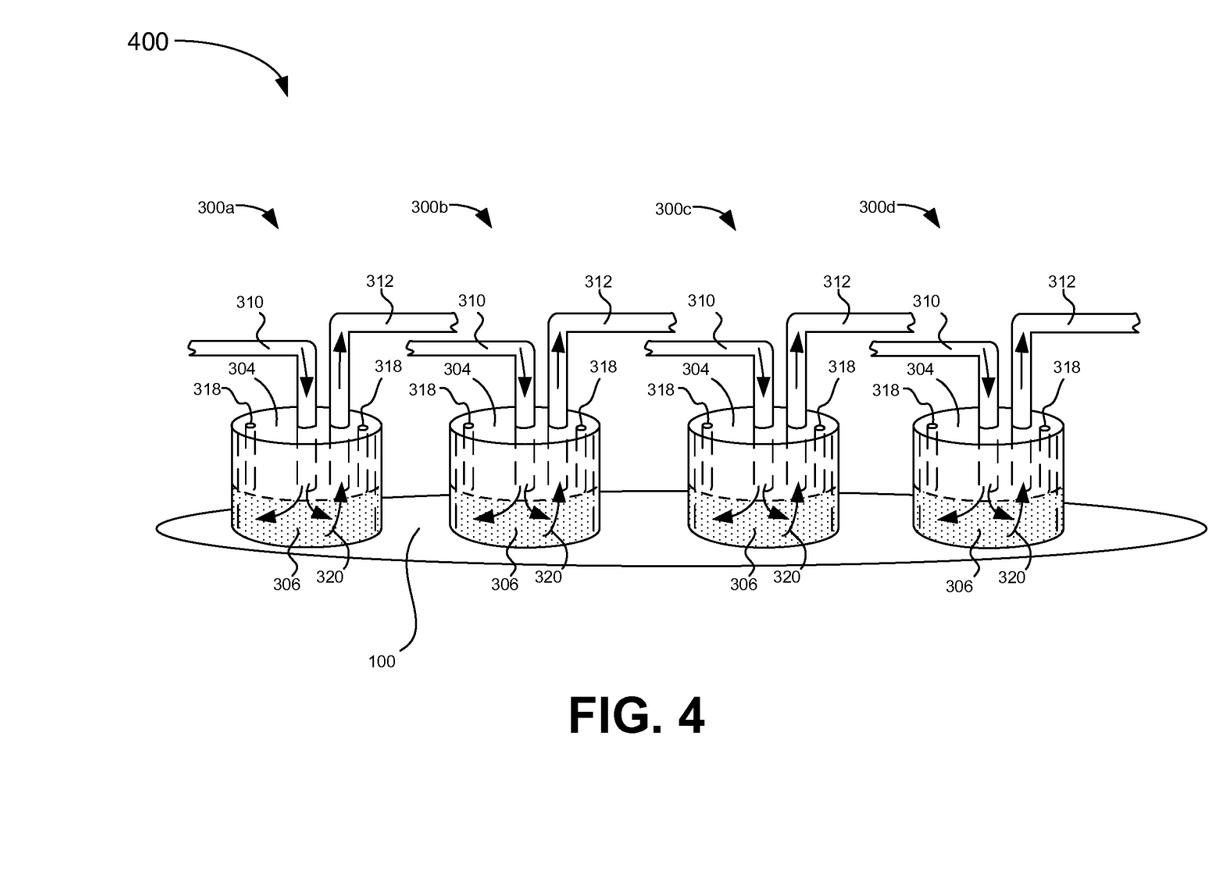
FIG. 4 illustrates combinatorial processing using vented cells.

FIG. 4 illustrates combinatorial processing using vented cells. Several cells 300a, 300b, 300c, and 300d are on the substrate 100. The cells, as described above, include vents 318 to provide more even flow through the chamber 306. Any number of cells 300 may be used with the various embodiments described herein. Additionally, cells 350 (i.e., those operating in bucket mode) may also be used.

Combinatorial processing can be performed by varying processing conditions between the cells 300. For example, the cell 300a can be processed using a first chemical, the cell 300b can be processed using a second chemical, and so on. Alternatively, the cells 300 can all be processed using the same chemicals with varying process conditions (e.g., different flow rates, temperatures, process times), or any combination of chemicals, process conditions, and/or process sequences.

Once the cells 300 have been processed, the processed regions can be characterized and compared to determine useful process conditions for larger scale (e.g., full-wafer) or subsequent combinatorial processing. Characterization can include taking measurements such as resistance and capacitance measurements, or analyzing results using microscopy such as with atomic force microscopy (AFM), scanning electron microscopy (SEM), etc. Characterization and analysis can be used to determine good candidates and processing conditions for further exploration and experimentation or integration into manufacturing.

Process for Combinatorial Processing

Figure 5:
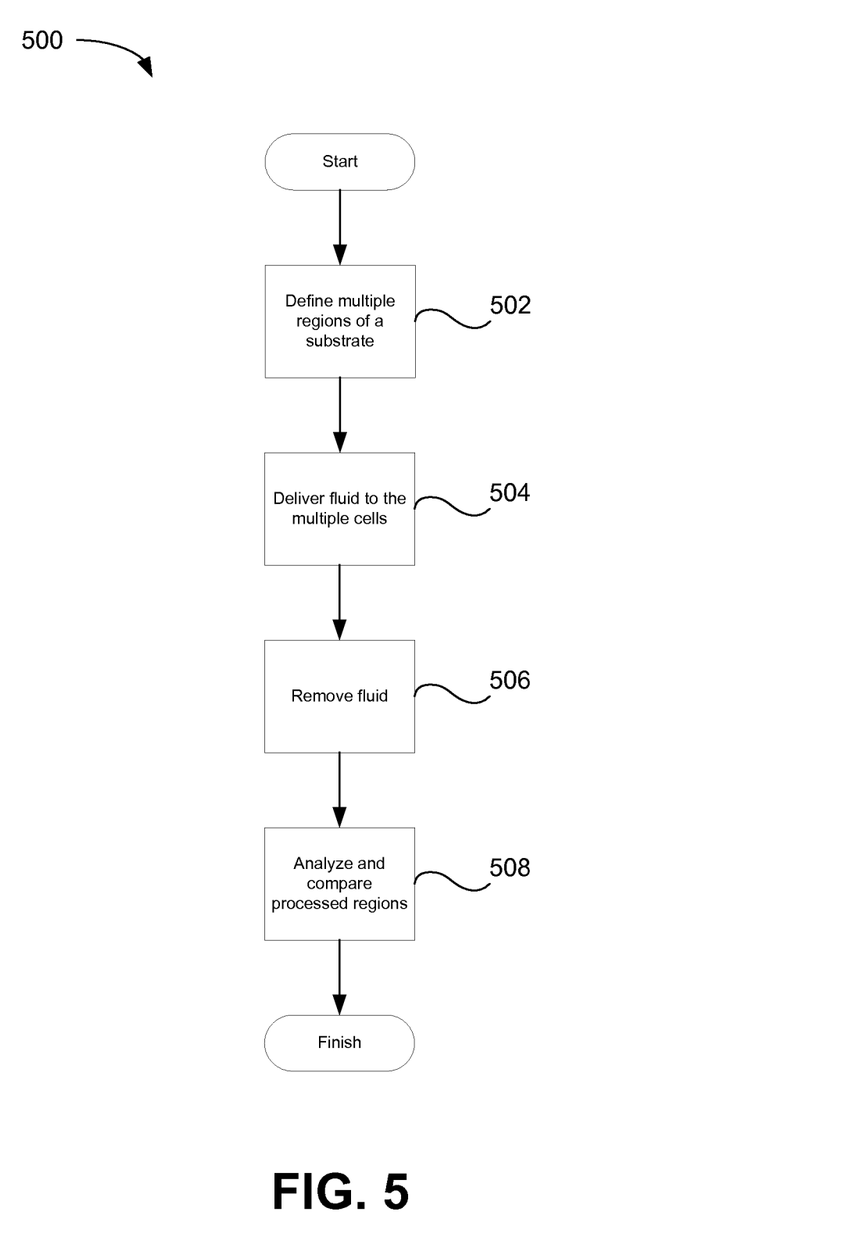
FIG. 5 is a flowchart describing a process for combinatorial processing using vented cells.

FIG. 5 is a flowchart describing a process 500 for combinatorial processing using vented cells. As described above, combinatorial processing includes performing multiple processing experiments across multiple regions of one or more substrates. For example, five chemical solutions can be tested three times each on one substrate for a total of fifteen experiments. These experimental variations can be performed sequentially, in parallel, or in parallel-serial mode by processing in some subset of the regions simultaneously. The fifteen experiments (e.g., regions) can be characterized to determine the efficacy of the various solutions, and some of those solutions may be chosen for further exploration.

In operation 502, multiple regions of a substrate are defined. The regions may be defined using multiple cells such as the cells 300, for example. Sleeves of the cells can be used to isolate regions in some embodiments. Any number of regions on one or more substrates may be defined according to various embodiments.

In operation 504, fluid is delivered to the multiple cells. The fluid may be a processing fluid used in semiconductor processing, such as a cleaning fluid, a deposition fluid (e.g., an electroless deposition fluid or an electrochemical deposition fluid), an etchant, etc. The fluid may be delivered using fluid source 308, for example. When the fluid is delivered to the multiple cells, the flow heads are vented to maintain consistent fluid flow through the multiple cells.

In operation 506, fluid is removed from the multiple cells. The fluid can be removed using the vacuum port 312, for example. If the cell 300 is operating in flow mode, the cell 300 can be evacuated by closing the valve 324 on the fluid source 308 and allowing the vacuum pump 316 to remove the fluid from the chamber 306. If the cell 300 is operating in bucket mode, the chamber 306 can be evacuated by lowering the flow head 304 toward the substrate 100 and squeezing the fluid out through the vacuum port 312. Since liquids are mostly not compressible, the vents 318 can be used to prevent liquids from backing up into the flow tube 310.

In operation 508, the processed regions are analyzed and compared. The analysis may include characterization such as electronic testing and other metrology. Electronic testing is used to determine capacitance, resistance, leakage, etc. for the regions pre- and post-processing. Metrology includes various other techniques for characterizing the region. Metrology may include microscopy, such as atomic force microscopy (AFM), scanning electron microscopy (SEM), and tunnel electron microscopy (TEM).

The analysis can reveal that certain process conditions yield advantageous results. These process conditions can be selected for further combinatorial or other processing, or can be integrated into manufacturing techniques (e.g., those performed on full wafers).

Although the foregoing examples have been described in some detail for purposes of clarity of understanding, the invention is not limited to the details provided. There are many alternative ways of implementing the invention. The disclosed examples are illustrative and not restrictive.

What is claimed:

1. A combinatorial processing apparatus comprising:
    a cell having a fluid seal for defining at least one region on a substrate;
    a flow head comprising at least one vent and disposed in the cell to dispense fluid into the at least one region, wherein the flow head, the substrate, and the cell define a process chamber above the at least one region and the flow head is configured to move within the cell towards the substrate;
    a protrusion extending from the flow head into the process chamber, wherein the protrusion is shaped to form a vacuum plenum around a periphery of the protrusion, wherein when the flow head is moved towards the substrate, the fluid is squeezed into the vacuum plenum;
    a fluid source attached to the flow head to deliver the fluid into the chamber; and
    a vacuum port extending through the flow head and in fluid communication with the vacuum plenum to remove the fluid from the chamber.

2. The apparatus of claim 1, wherein the fluid seal forms a seal with the substrate to define one of a plurality of regions on the substrate for processing.

3. The apparatus of claim 1, wherein the at least one vent vents to atmospheric pressure.

4. The apparatus of claim 1, wherein the fluid source dispenses the fluid at a first pressure, and the vacuum port removes the fluid using a second pressure.

5. The apparatus of claim 2, wherein the plurality of regions on the substrate are configured to be processed by combinatorial processing.

6. The apparatus of claim 1, wherein the at least one vent is configured to equalize a flow rate of the fluid through the chamber.

7. The apparatus of claim 6, further comprising multiple vents to provide consistent flow rates within the chamber.

8. The apparatus of claim 1, wherein a first width of the protrusion is less than a second width of the flow head such that a gap is formed around the periphery of the protrusion between the protrusion and the cell.

9. The apparatus of claim 1, further comprising a valve attached to the fluid source, wherein the valve is closed to evacuate the chamber.

10. The apparatus of claim 1, wherein a substantially constant level of the fluid is maintained at an inlet of the vacuum port.

11. A combinatorial processing system comprising:
    a plurality of cells defining a plurality of processing regions on a substrate, each one of the plurality of cells comprising:
    a sleeve forming a fluid seal with the substrate;
    a flow head disposed in the sleeve such that the flow head and the sleeve define a process chamber above a respective one of the processing regions on the substrate, wherein the flow head comprises at least one vent which vents to a first pressure and is configured to move within the seal towards the substrate; and
    a protrusion extending from the flow head into the process chamber, wherein the protrusion is shaped to form a vacuum plenum around a periphery of the protrusion, wherein when the flow head is moved towards the substrate, fluid in the process chamber is squeezed into the vacuum plenum;
    the combinatorial processing system further comprising:
    a plurality of fluid sources, each one of the plurality of fluid sources configured to deliver the fluid to the respective process chamber of the each one of the plurality of respective cells at a second pressure; and
    a plurality of a vacuum ports, each one of the plurality of vacuum ports extending through the respective flow head of the each one of the plurality of respective cells and in fluid communication with the respective vacuum plenum of the each one of the plurality of respective cells to remove the fluid from the respective process chamber using a third pressure.

12. The apparatus of claim 11, wherein the plurality of cells define the plurality of processing regions on the substrate, and at least one of the processing regions is processed differently from another of the processing regions by varying one of materials, process conditions, or process sequences.

13. The apparatus of claim 11, wherein within the each one of the plurality of cells, a first width of the respective protrusion is less than a second width of the respective flow head such that a gap is formed around the periphery of the respective protrusion between the respective protrusion and the respective sleeve.

14. The apparatus of claim 11, wherein each of the at least one vent is configured to equalize a flow rate of the fluid through the respective process chamber.

15. The apparatus of claim 11, wherein the first pressure is atmospheric pressure.

16. The apparatus of claim 11, wherein the second pressure and the third pressure are chosen to maintain a substantially constant level of the fluid in the respective process chamber.

\* \* \* \* \*